United States Patent
Bai et al.

(10) Patent No.: US 10,117,357 B2
(45) Date of Patent: Oct. 30, 2018

(54) STATIONARY COOLING STRUCTURE FOR BOARD/CHASSIS-LEVEL CONDUCTION COOLING

(71) Applicant: Futurewei Technologies, Inc., Plano, TX (US)

(72) Inventors: Mo Bai, San Jose, CA (US); Vadim Gektin, San Jose, CA (US)

(73) Assignee: FUTUREWEI TECHNOLOGIES, INC., Plano, TX (US)

( * ) Notice: Subject to any disclaimer, the term of this patent is extended or adjusted under 35 U.S.C. 154(b) by 0 days.

(21) Appl. No.: 14/803,812

(22) Filed: Jul. 20, 2015

(65) Prior Publication Data
US 2017/0027083 A1   Jan. 26, 2017

(51) Int. Cl.
*H05K 7/20* (2006.01)

(52) U.S. Cl.
CPC ..... *H05K 7/20509* (2013.01); *H05K 7/20536* (2013.01); *H05K 7/20672* (2013.01)

(58) Field of Classification Search
CPC .............................. H05K 7/20509; H05K 7/20
See application file for complete search history.

(56) References Cited

U.S. PATENT DOCUMENTS

| | | | | |
|---|---|---|---|---|
| 3,735,206 A * | 5/1973 | Pesek | ................. | H05K 7/20545 361/721 |
| 4,318,157 A * | 3/1982 | Rank | ................. | H05K 7/20545 361/704 |
| 4,867,235 A * | 9/1989 | Grapes | ................ | H01L 23/3733 165/185 |
| 5,220,485 A * | 6/1993 | Chakrabarti | ......... | H05K 7/1404 165/185 |
| 5,287,248 A * | 2/1994 | Montesano | ............. | F28F 21/00 165/185 |
| 7,508,670 B1 * | 3/2009 | Thorson | ............. | H05K 7/20636 165/104.33 |
| 7,859,837 B2 * | 12/2010 | Nemoz | .............. | H05K 7/20563 165/80.3 |
| 8,879,260 B2 * | 11/2014 | Kalms | ....................... | G06F 1/20 165/104.33 |
| 2007/0070601 A1 * | 3/2007 | Vos | ..................... | H05K 7/20563 361/694 |
| 2009/0225510 A1 * | 9/2009 | Biemer | .............. | H05K 7/20563 361/690 |
| 2009/0229808 A1 * | 9/2009 | Chu | .......................... | F28F 3/06 165/185 |
| 2009/0296350 A1 * | 12/2009 | Oki | ..................... | G02B 6/4201 361/709 |

(Continued)

*Primary Examiner* — James Wu
*Assistant Examiner* — Michael Matey
(74) *Attorney, Agent, or Firm* — Vierra Magen Marcus LLP

(57) ABSTRACT

The present disclosure relates to a cold plate and vapor chamber for conduction cooling of one or more printed circuit boards in a printed circuit board (PCB) enclosure. The cold plate may include a planar surface at an oblique angle relative to an axis along which the PCB assembly is inserted into the enclosure. The PCB assembly may include a vapor chamber having a complementary obliquely angled surface. The complementary angled surfaces of the cold plate and vapor chamber may exert forces against each other upon insertion of the printed circuit board assembly into the enclosure and contact between the cold plate and vapor chamber.

11 Claims, 8 Drawing Sheets

(56) References Cited

U.S. PATENT DOCUMENTS

| | | | |
|---|---|---|---|
| 2014/0133093 A1* | 5/2014 | Cox | H01L 23/367 361/679.54 |
| 2014/0247555 A1* | 9/2014 | Arvelo | H05K 7/20772 361/699 |
| 2015/0168087 A1* | 6/2015 | Kim | F28F 21/08 361/720 |
| 2015/0230365 A1* | 8/2015 | Kaplun | B23P 15/26 361/689 |
| 2015/0289413 A1* | 10/2015 | Rush | H05K 7/20672 361/700 |
| 2016/0100505 A1* | 4/2016 | Reid | H05K 7/20436 361/714 |

* cited by examiner

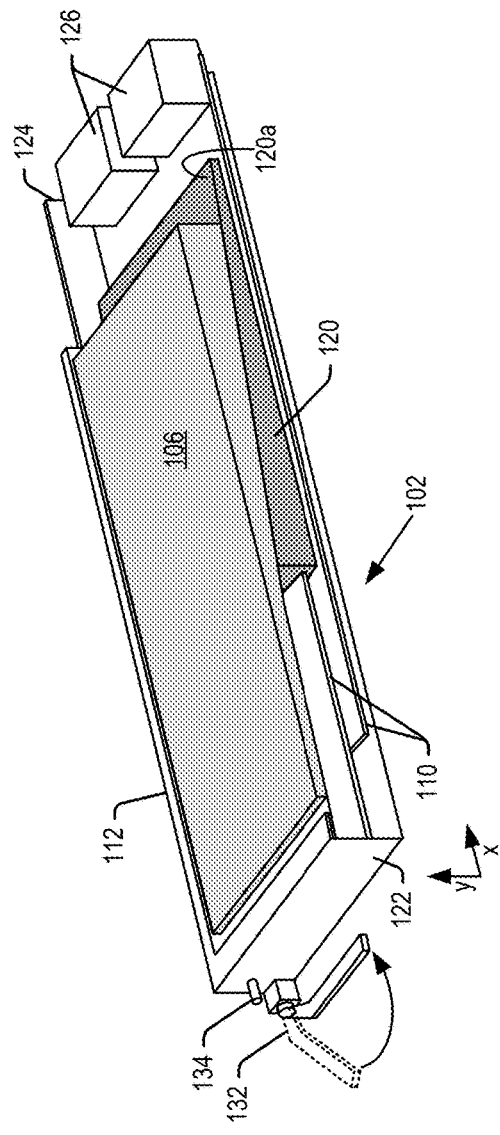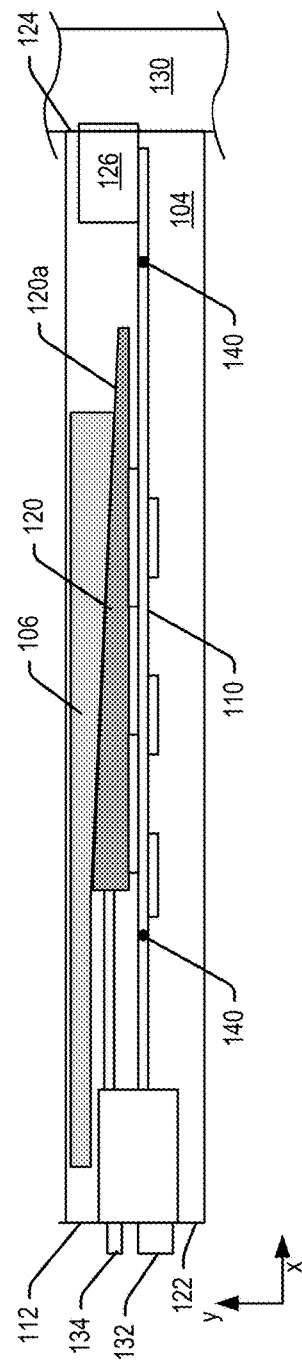

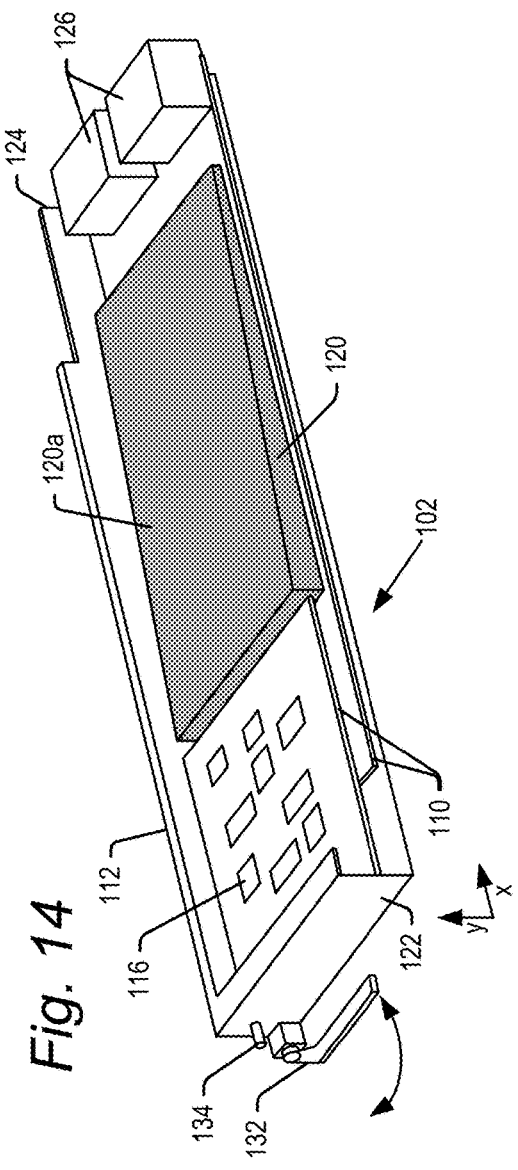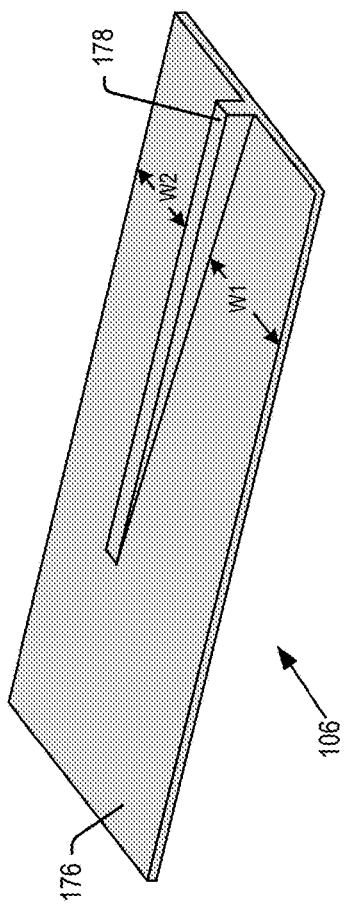

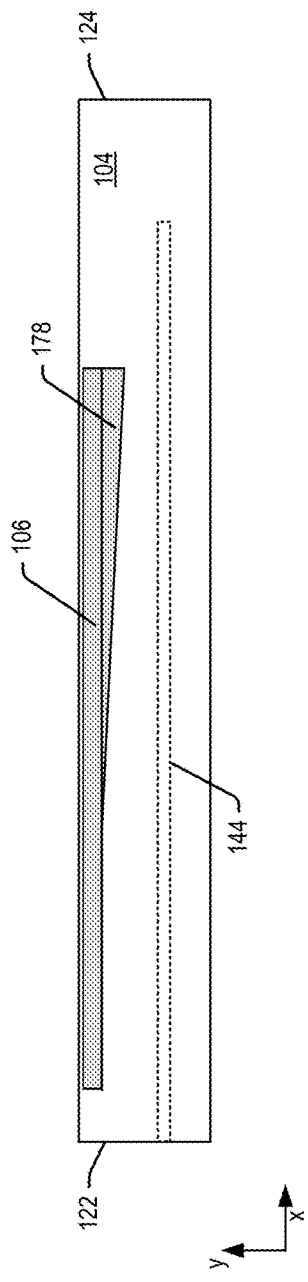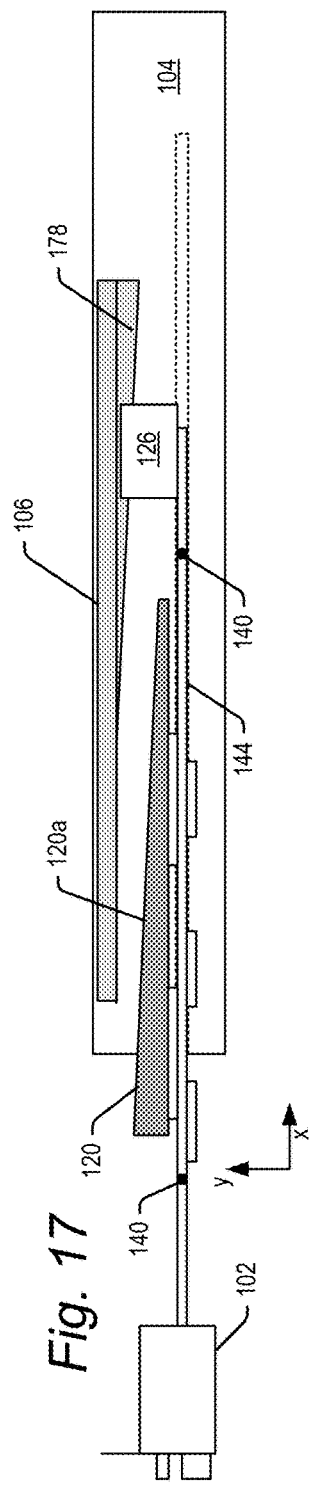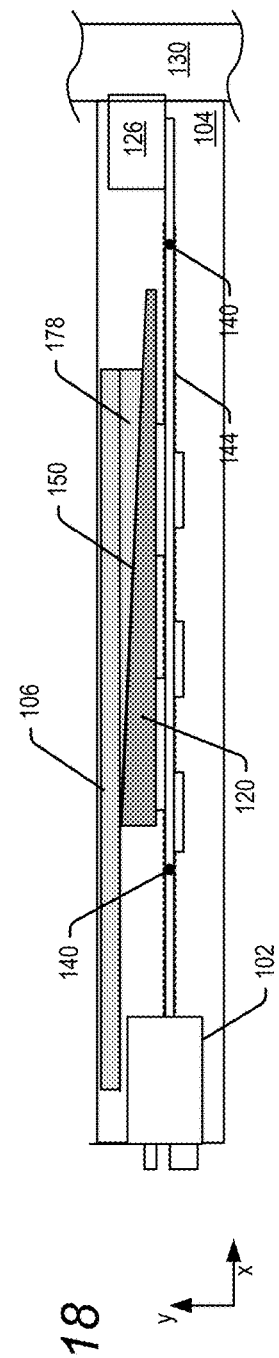

STATIONARY COOLING STRUCTURE FOR BOARD/CHASSIS-LEVEL CONDUCTION COOLING

BACKGROUND

Enclosures for housing electronic circuit boards are widely used in a variety of technologies, including telecommunications, industrial control, medical electronics and military applications. Such enclosures are provided with individual bays having guides so that individual circuit boards can be slid into and out of the bays, and a backplane through which the circuit boards in respective bays may be electrically connected to other electronic components.

The electronic components on the printed circuit boards generate heat, which should be removed in order to prevent failure of the printed circuit boards within the enclosure. One method of heat removal is through conduction cooling, where heat is diffused through components in the printed circuit boards and the enclosure independently of any air circulation. It is known to provide a heat sink, called a cold plate, as part of enclosure bays. The assembly including the printed circuit boards also includes a heat exchanger, called a vapor chamber. In operation, a printed circuit board assembly is inserted along an axis (e.g., the x-axis). Guides within the enclosure bays then guide the printed circuit board assembly in along the x-axis and orthogonally upward (e.g., along the y-axis), attempting to bring the vapor chamber into physical contact with the cold plate.

While cold plates and vapor chambers are commonly used for conducting heat away from the printed circuit boards, such conventional systems suffer a drawback in that it is difficult to establish good contact between a vapor chamber on the printed circuit board assembly with the cold plate in the enclosure bay. Heat conduction falls off with a space between the vapor chamber and cold plate, and it is critical to establish a good, tight contact between the vapor chamber and cold plate. One cause of the poor contact between the cold plate and vapor chamber in conventional designs is that the contact interface between the vapor chamber and cold plate is parallel to the insertion direction of the printed circuit board assembly. Thus, it is difficult to establish the requisite force between the cold plate and vapor chamber for good thermal conductivity.

SUMMARY

In one embodiment, the present technology relates to an enclosure for housing one or more printed circuit board assemblies inserted in an insertion direction into one or more bays of the enclosure, the enclosure comprising: a cold plate, formed on a surface of a bay of the one or more bays, the cold plate comprising a first surface for conducting heat away from a printed circuit board assembly by contact between the first surface of the cold plate and a second surface of the printed circuit board assembly, the first surface of the cold plate provided at an oblique angle with respect to the insertion direction, the oblique angle enabling a contact force between the first surface of the cold plate and the second surface of the printed circuit board assembly, the contact force promoting heat conduction.

In another embodiment, the present technology relates to an enclosure for housing one or more printed circuit board assemblies inserted in an insertion direction into one or more bays of the enclosure, the enclosure comprising: a cold plate, formed on a surface of a bay of the one or more bays, the cold plate comprising a first surface for conducting heat, the first surface of the cold plate provided at an oblique angle with respect to the insertion direction; and a vapor chamber formed in the printed circuit board assembly, the vapor chamber comprising a second surface for conducting heat, the second surface of the vapor chamber provided at an angle complementary to the oblique angle of the first surface of the cold plate, the complementary angle of the second surface and the oblique angle of the first surface enabling a contact force between the first and second surfaces upon insertion of the printed circuit board assembly into the bay and contact between the first and second surfaces, the contact force promoting heat conduction.

In a further embodiment, the present technology relates to a printed circuit board assembly for use within an enclosure, the printed circuit board configured for insertion in an insertion direction into one or more bays of the enclosure, the printed circuit board assembly comprising: a heat exchanger, formed on a surface of the printed circuit board assembly, the heat exchanger comprising a first surface for conducting heat away from the printed circuit board assembly by contact between the first surface of the printed circuit board assembly and a second surface of the enclosure, the first surface of the printed circuit board assembly provided at an oblique angle with respect to the insertion direction, the oblique angle enabling a contact force between the first surface of the printed circuit board assembly and the second surface of the enclosure, the contact force promoting heat conduction.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter. The claimed subject matter is not limited to implementations that solve any or all disadvantages noted in the Background.

BRIEF DESCRIPTION OF THE DRAWINGS

FIG. 2 is a cross-sectional perspective view of a printed circuit board assembly including a vapor chamber in contact with a cold plate of an enclosure bay according to embodiments of the present technology.

FIG. 3 is a cross-sectional edge view of a printed circuit board assembly including a vapor chamber in contact with a cold plate of an enclosure bay according to embodiments of the present technology.

FIGS. 14 and 15 are top and bottom perspective views of a printed circuit board assembly and cold plate according to a further alternative embodiment of the present technology.

FIGS. 16-18 are cross-sectional edge views of an enclosure bay and printed circuit board assembly according to the alternative embodiment of FIGS. 14 and 15.

DETAILED DESCRIPTION

Figure 1:
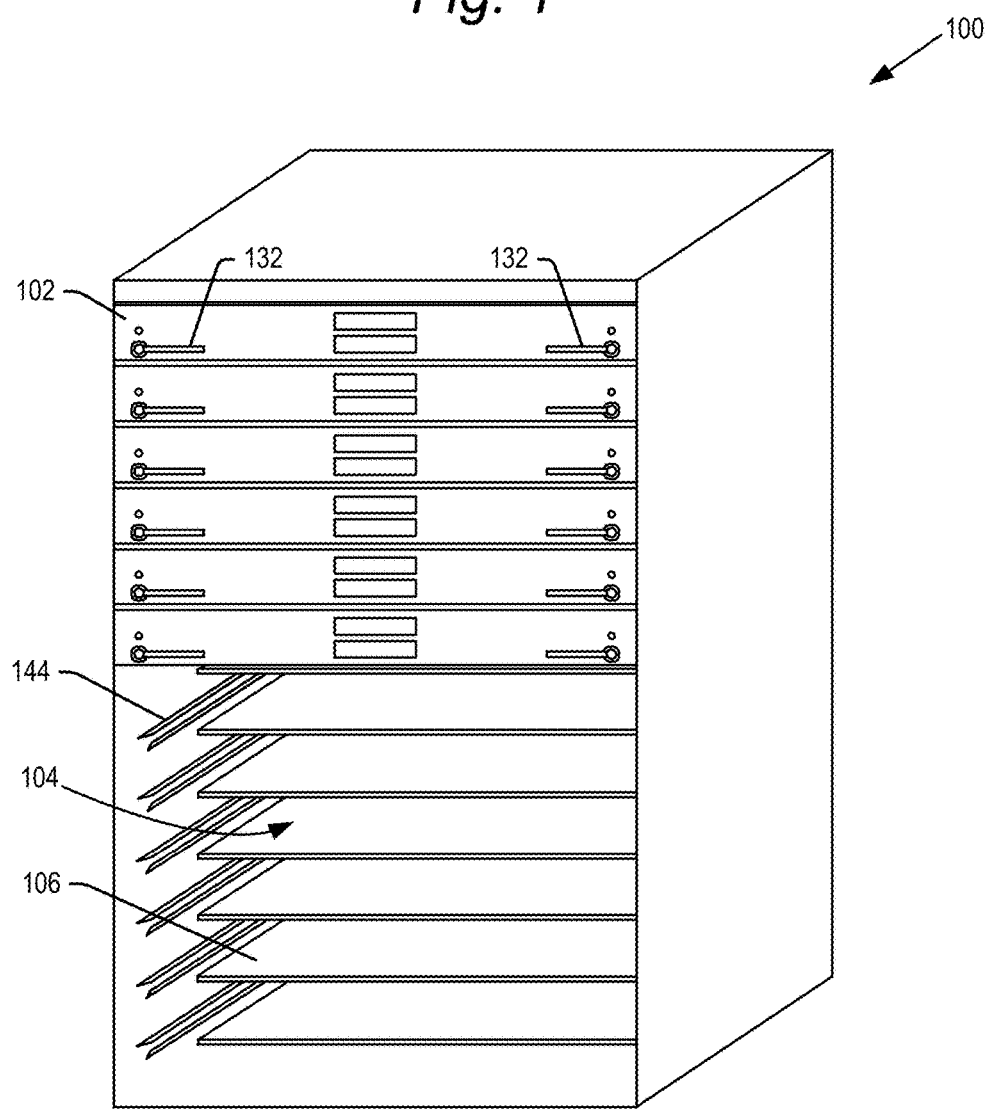
FIG. 1 is a perspective view of an enclosure including a number of printed circuit board assemblies, and showing cold plates in unfilled bays of the enclosure according to embodiments of the present technology.

The present technology, roughly described, relates to a cold plate and vapor chamber for conduction cooling of one or more printed circuit boards in a printed circuit board (PCB) enclosure. In embodiments, the cold plate may be affixed within or formed as part of an enclosure bay and may include a planar surface at an oblique angle relative to an axis along which the PCB assembly is inserted into the bay. As used herein, an oblique angle is a non-zero angle, including 90°. The PCB assembly may include a vapor chamber having a complementary obliquely angled surface. The complementary angled surfaces of the cold plate and vapor chamber rest tightly against each other once the PCB assembly is fully seated within the enclosure bay. Tight contact may in part be provided by forces at the angled contact interface between the cold plate and vapor chamber, which forces have components parallel to the direction of insertion of the PCB assembly.

In embodiments, the PCB assembly may include one or more electrical connection sockets at a distal end of the PCB assembly for mating with connector pins in a backplane of the enclosure. In embodiments, the sockets may extend off the PCB higher than the vapor chamber. In such embodiments, the PCB assembly may include guide pins that ride within angled guide rails in the enclosure bay. The guide rails allow the PCB assembly to slide into an enclosure bay at a first elevation where the sockets clear the cold plate. Once the PCB assembly has been inserted to a point where the sockets are clear of the cold plate, the guide rails may guide the PCB assembly to a second elevation where the sockets connect with the backplane, and the angled contact interface between the cold plate and vapor chamber may be established.

A system according to the present technology has several advantages including for example providing an easy, effective and efficient method of establishing a high contact pressure between a cold plate and a vapor chamber for PCB assemblies in an enclosure. This in turns leads to effective conduction heat transfer path to cool the PCB assemblies in the enclosure. This also in turn allows an overall reduction in enclosure design complexity, as other conventional mechanisms used in an attempt to establish good contact pressure may be omitted.

It is understood that the present invention may be embodied in many different forms and should not be construed as being limited to the embodiments set forth herein. Rather, these embodiments are provided so that this disclosure will be thorough and complete and will fully convey the invention to those skilled in the art. Indeed, the invention is intended to cover alternatives, modifications and equivalents of these embodiments, which are included within the scope and spirit of the invention as defined by the appended claims. Furthermore, in the following detailed description of the present invention, numerous specific details are set forth in order to provide a thorough understanding of the present invention. However, it will be clear to those of ordinary skill in the art that the present invention may be practiced without such specific details.

The terms "top" and "bottom," "upper" and "lower" and "vertical" and "horizontal," and "distal" and "proximal" as may be used herein are by way of example and illustrative purposes only, and are not meant to limit the description of the invention inasmuch as the referenced item can be exchanged in position and orientation. Also, as used herein, the terms "substantially" and/or "about" mean that the specified dimension or parameter may be varied within an acceptable manufacturing tolerance for a given application. In one embodiment, the acceptable manufacturing tolerance is ±0.25%.

Referring now to FIG. 1, there is shown enclosure, or chassis, 100 for housing a plurality of PCB assemblies 102. The PCB assemblies 102 may be housed within bays 104 along a height of the enclosure 100. The illustrated example shows PCB assemblies 102 in upper bays 104 of the enclosure 100, with lower bays 104 being empty. Each bay 104 may include a cold plate 106 as explained hereinafter. FIGS. 2-18 show the cold plate 106 formed in an upper portion of each bay 104. However, as will be explained, the cold plate 106 may be formed in a lower portion of each bay 104 in further embodiments. The enclosure 100 may be sized to receive varying numbers of PCB assemblies 102, and PCB assemblies 102 of varying dimensions. While enclosure 100 shows a single column of bays 104, the enclosure 100 may have more than one column of bays in further embodiments.

FIG. 2 is a perspective view of an embodiment of PCB assembly 102 cross-sectioned along a planar edge of the PCB assembly 102. FIG. 3 is a cross-sectional edge view of an embodiment of the PCB assembly 102. The PCB assembly 102 of FIGS. 2 and 3 is shown in position within a bay 104 of enclosure 100, with only a cold plate 106 of the bay 104 being shown for ease of understanding. The cold plate 106 may be formed of a metal with high thermal conductivity, such as for example aluminum. The cold plate 106 may be formed of other materials in further embodiments. The cold plate may be affixed to the bay 104, or may be formed integrally as part of the walls of bay 104.

The PCB assembly 102 may include one or more printed circuit boards 110 mounted within a tray 112. The printed circuit boards 110 may include a number of discrete electronic components 116 (shown schematically in FIG. 14), which components may include for example integrated circuits, diodes, transistors, resistors and/or capacitors. The one or more printed circuit boards 110 may be provided to perform any of a wide variety of functions, related for example to telecommunications.

A vapor chamber 120 may be provided in the PCB assembly 102 adjacent to one or more printed circuit boards 110. The vapor chamber 120 may be formed of a thermally conductive metal such as for example copper, though other materials are contemplated. An exterior surface 120a may be sloped at an oblique angle relative to a direction of insertion of the PCB assembly 102 into bay 104 as explained hereinafter. In embodiments, sloped surface 120a may form an angle of between about 2° and 10° with the x-axis, though the slope of surface 120a may be greater or lesser than that in further embodiments.

In embodiments, vapor chamber 120 may extend across substantially all of the width of tray 112, though it may be narrower than that in further embodiments, depending for example on space constraints and heat conduction requirements. The length of the vapor chamber 120 between the proximal and distal ends may vary depending for example on space constraints, heat conduction requirements and the angle of the sloped surface 120a as explained hereinafter.

The PCB assembly 102 may include a proximal end 122 and a distal end 124, with the distal end 124 being inserted first into the bay 104 of enclosure 100. Distal end 124 may include one or more electrical connector sockets 126 of known construction for mating with pins on a backplane 130 when the PCB assembly 102 is fully inserted into a bay 104. Proximal end 122 may include a pair of spaced apart locking levers 132 (the second locking lever is shown in FIG. 1 and omitted from the cross-sectional view of FIG. 2).

Once a PCB assembly 102 has been manually pushed into a bay 104, locking levers 132 may be manually actuated in the direction of the arrow in FIG. 2 from an unlocked position (shown in dashed lines) to a locked position. Actuation of the locking levers 132 secures the PCB assembly 102 in a fully inserted position within a bay 104 (i.e., the sockets 126 engaged with pins in the backplane 130, and a tight contact between the cold plate 106 and vapor chamber 120). An end of each lever 132 may include a pawl (not shown) within the tray 112 which engages a rod (not shown) when the PCB assembly 102 is manually inserted into a bay 104. The pawls grab the rods as the levers are moved to the locked positions to pull the PCB assembly 102 into a fully inserted position within the bay 104. An adjustment knob 134 may be provided for each locking lever 132 for adjusting the locking force achieved by locking of the levers 132.

Figure 4:
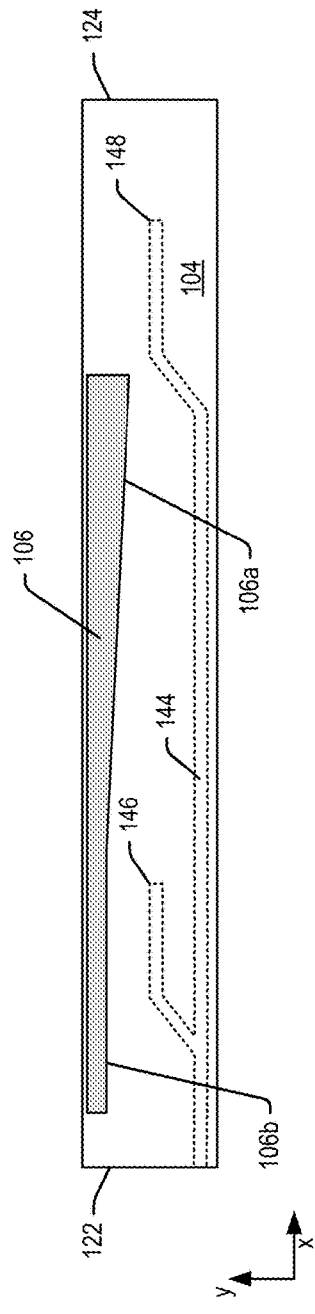
FIG. 4 is a cross-sectional edge view of an enclosure bay including a cold plate and guide rails according to embodiments of the present technology.

FIG. 4 is a cross-sectional side view of a bay 104 including a cold plate 106. Cold plate 106 may include a sloped surface 106a provided at an oblique angle with respect to the direction of insertion of the PCB assembly into bay 104. In embodiments, sloped surface 106a may form an angle of between about −2° and −10° with the x-axis, though the slope of surface 106a may be greater or lesser than that in further embodiments. In embodiments, the angle of sloped surface 106a of cold plate 106 may correspond (be complementary) to the angle of the sloped surface 120a of vapor chamber 120 so that the surfaces 106a and 120a may mate cleanly and tightly with each other over a planar contact interface between the two surfaces. As explained below, a thin sheet of thermally conductive material may be affixed to one of the sloped surfaces 106a or 120a to provide good thermal conduction between the vapor chamber 120 and cold plate 106 even in the event that surfaces 106a and 120a do not mate cleanly with each other.

In embodiments, cold plate 106 may extend across substantially all of the width of bay 104, though it may be narrower than that in further embodiments depending for example on space constraints and heat conduction requirements. The length of the cold plate 106 may vary depending for example on space constraints, heat conduction requirements and the angle of the sloped surface 106a as explained hereinafter. In embodiments, the cold plate 106 may further include a section 106b near the proximal end having a uniform thickness along its length. Section 106b joins with sloped surface 106a, which has an increasing thickness along its length.

PCB assembly 102 may further include two pairs of guide pins 140 for engaging within a pair of guide rails 144. First and second guide pins 140 from one side of the PCB assembly 102 are shown for example in FIGS. 3 and 5-8. A second set of guide pins 140, matching the first set, would be provided in the second, opposed side of the PCB assembly 102. One set of guide rails 144 on a first wall of bay 104 are shown for example in FIGS. 1 and 4-8. A second set of guide rails, matching the first set, would be provided in the second, opposed wall of bay 104. As shown for example in FIG. 4, guide rails 144 include channels 146 and 148 which angle up toward cold plate 106.

Figure 5:
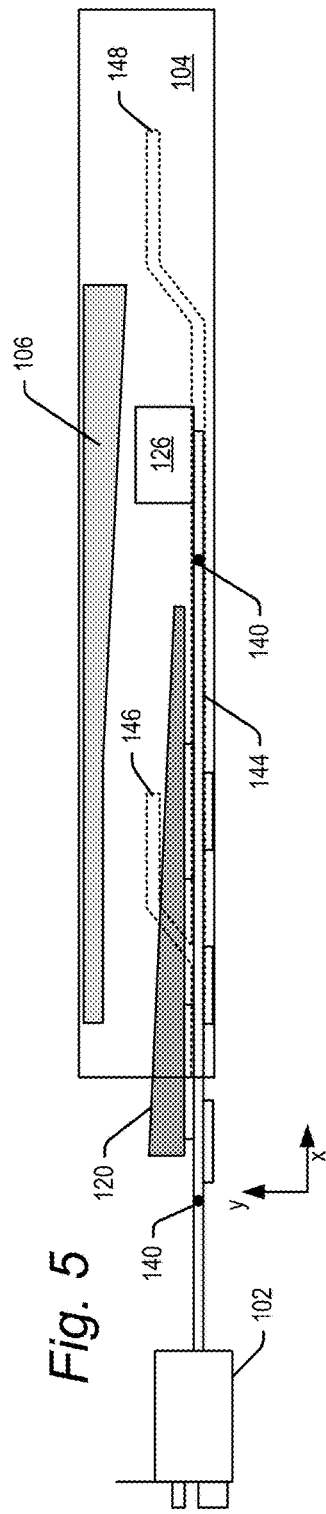
FIG. 5 is a cross-sectional edge view of an enclosure bay and a printed circuit board assembly at a first stage of insertion into the enclosure bay.
Figure 6:
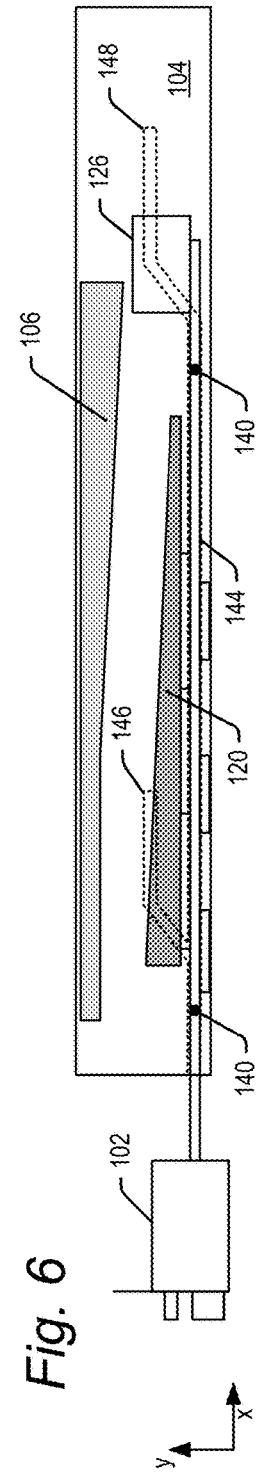
FIG. 6 is a cross-sectional edge view of an enclosure bay and a printed circuit board assembly at a second stage of insertion into the enclosure bay.

In order to insert a PCB assembly 102 into a selected, empty bay 104, the distal-most set of guide pins 140 on opposed sides of PCB assembly 102 would be inserted between guide rails 144 on opposed sides of bay 104 (FIGS. 1 and 5). The PCB assembly 102 is slid into the bay and the proximal-most set of guide pins 140 on opposed sides of the PCB assembly 102 are also inserted between guide rails 144 on opposed sides of bay 104 (FIG. 6). As seen in FIG. 6, the guide rails 144 are positioned at a bottom portion of the bay 104 so that the electrical sockets 126 slide below the cold plate 106 with a clearance space therebetween.

Figure 7:
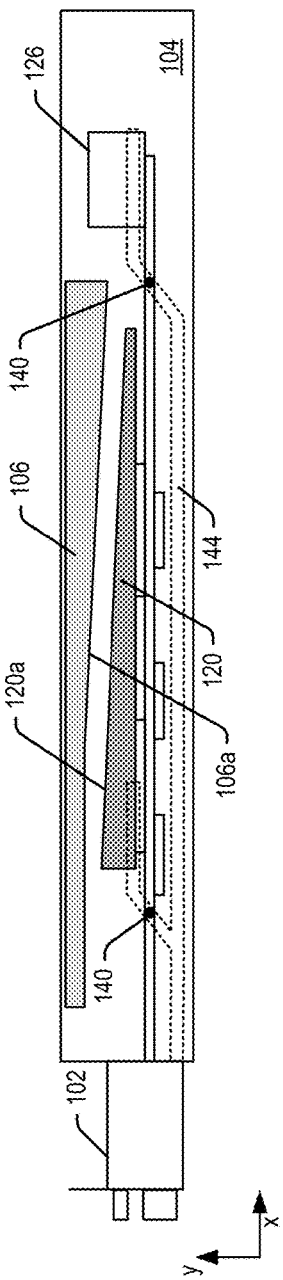
FIG. 7 is a cross-sectional edge view of an enclosure bay and a printed circuit board assembly at a third stage of insertion into the enclosure bay.

Referring now to FIG. 7, the channels 146 and 148 are configured and positioned with respect to the cold plate 106 such that, once the socket 126 clears the end of the cold plate during insertion of the PCB assembly 102, the two pairs of pins 140 engage within respective channels 146 and 148. Such engagement raises the PCB assembly 102 upward (along y-axis) toward cold plate 106 upon continued insertion of the PCB assembly 102 (along x-axis).

Figure 8:
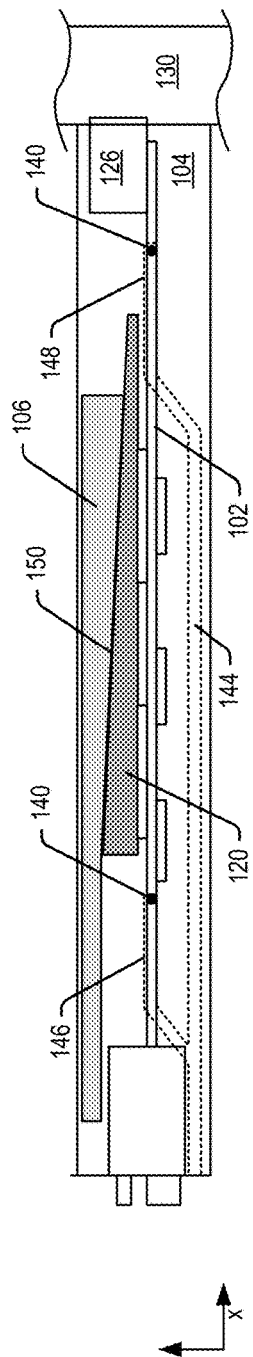
FIG. 8 is a cross-sectional edge view of a printed circuit board assembly fully seated within an enclosure bay.

Upon full insertion of the PCB assembly 102 (either manually or by actuation of locking levers 132 as explained above), the sockets 126 properly mate with pins in backplane 130 as shown in FIG. 8 to electrically connect the one or more printed circuit boards 110 of PCB assembly 102 with the backplane 130. As also shown in FIG. 8, in accordance with aspects of the present technology, once the PCB assembly is fully inserted into bay 104, the respective surfaces 120a of vapor chamber 120 and 106a of cold plate 106 mate with each other over a contact interface 150.

The cold plate 106 and vapor chamber 120 are positioned with respect to sockets 126 such that the sufficient contact interface 150 between cold plate surface 106a and vapor chamber surface 120a is established just prior to, or at the same time as, the socket 126 reaching a hard stop within backplane 130. In embodiments, the sockets 126 may electrically connect to the backplane 130 one to two millimeters (with respect to movement along the x-axis) before the sockets 126 reach a hard stop with backplane 130. In other words, the sockets may have a tolerance of one to two millimeters for connecting with the backplane. The cold plate 106 and vapor chamber 120 are positioned to contact each other after sockets 126 electrically connect to backplane 130, and before the hard stop of the sockets 126 against backplane 130, i.e., within the above-defined one to two millimeter tolerance. It is understood that the tolerance may be less than one millimeter and more than two millimeters in further embodiments of the present technology.

Figure 9:
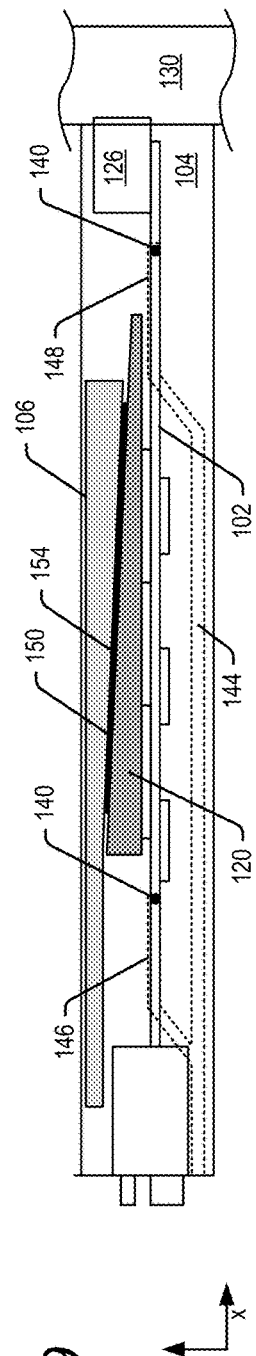
FIG. 9 is a cross-sectional edge view of an enclosure bay and printed circuit board assembly according to an alternative embodiment of the present technology.

Referring to FIG. 9, a thin sheet 154 of thermally conductive elastomer or polymer may be provided on one of the surfaces 106a and 120a. This sheet 154 may compress between surfaces 106a and 120a to further increase the tolerance in providing a tight fit and good thermal conductivity at contact interface 150. The sheet 154 may have other select properties, such as for example being an electrical insulator. The sheet 154 may alternatively be an electrical conductor, thereby providing a path to ground through vapor chamber 120 and cold plate 106 to alleviate electrostatic discharge from the PCB assembly 102.

The configuration and arrangement of cold plate 106 and vapor chamber 120 according to the present technology provides advantages in that pure translation along the direction of insertion (i.e., along the x-axis) creates contact forces between the cold plate 106 and vapor chamber 120 ensuring a tight fit, and good thermal conduction, between plate 106 and chamber 120. It is understood that the cold plate and vapor chamber 120 may have other corresponding configurations in further embodiments to provide the same advantages.

Figure 10:
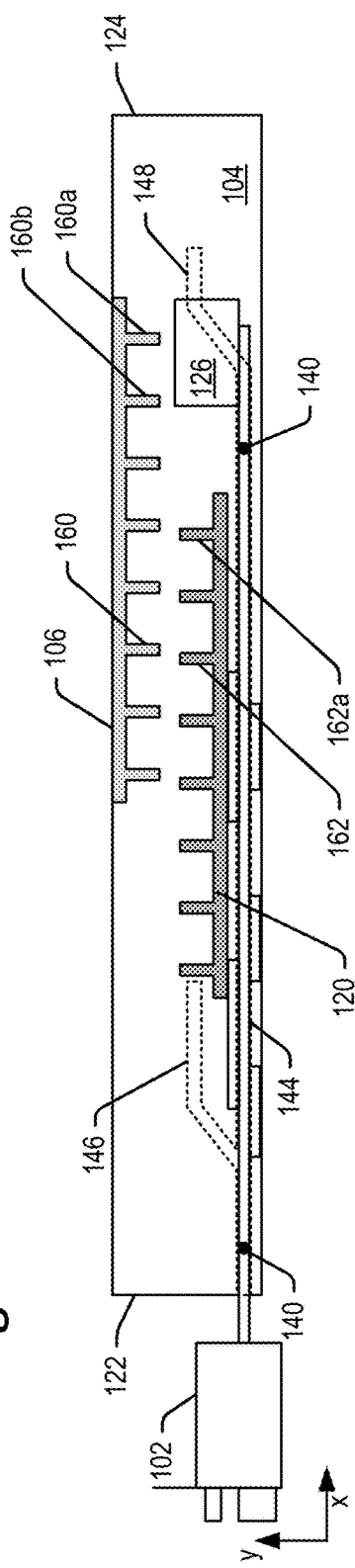
FIGS. 10 and 11 are cross-sectional edge views of an enclosure bay and printed circuit board assembly according to a further alternative embodiment of the present technology.
Figure 11:
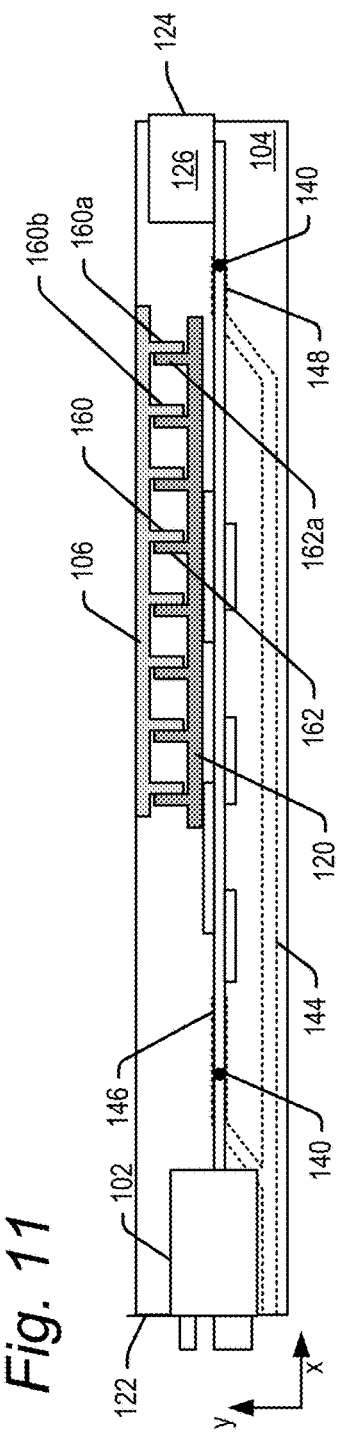

For example, FIGS. 10 and 11 illustrate a further embodiment, where the cold plate 106 includes a number of fins 160 extending laterally (perpendicular to the x-axis). The fins 160 may extend parallel to the y-axis down away from the cold plate 106, but the fins 160 may be angled toward the proximal end 122 in further embodiments. Likewise, the vapor chamber 120 may include a number of laterally extending fins 162, in corresponding relation and spacing to the fins 160. The fins 162 may extend parallel to the y-axis up away from the vapor chamber 120, but the fins 162 may be angled toward the distal end 124 in embodiments where fins 160 are angled toward the proximal end 122.

As indicated in FIGS. 10 and 11, the PCB assembly 102 may be slid into a bay 104 with guide pins 140 riding within guide rails 144 as explained above so that there is a clearance space between the fins 160 on the one hand and the sockets 126 and fins 162 on the other. Once the sockets 126 are clear of the cold plate 106 upon insertion along the x-axis, the pins 140 may enter channels 146 and 148 to lift the PCB assembly 102 upward toward cold plate 106 to allow mating of the sockets 126 with the backplane 130. At some point after electrical connection of the sockets 126 with the backplane 130, and before a dead stop of the sockets 126 against backplane 130, the fins 162 of vapor chamber 120 engage against the fins 160 of cold plate 106 as shown in FIG. 11 for efficient heat conduction away from the PCB assembly 102.

In this embodiment, the fins 160 and 162 may be configured so that the corresponding fins correctly mate with each other upon upward and inward movement of the PCB assembly 102 in channels 146 and 148. For example, the respective fins are configured such that a fin 162a of vapor chamber 120 clears a fin 160b in cold plate 106 as it moves up along the y-axis and in along the x-axis. Upon clearing the fin 160b, the fin 162a may properly mate against fin 160a as shown in FIG. 11.

Figure 12:
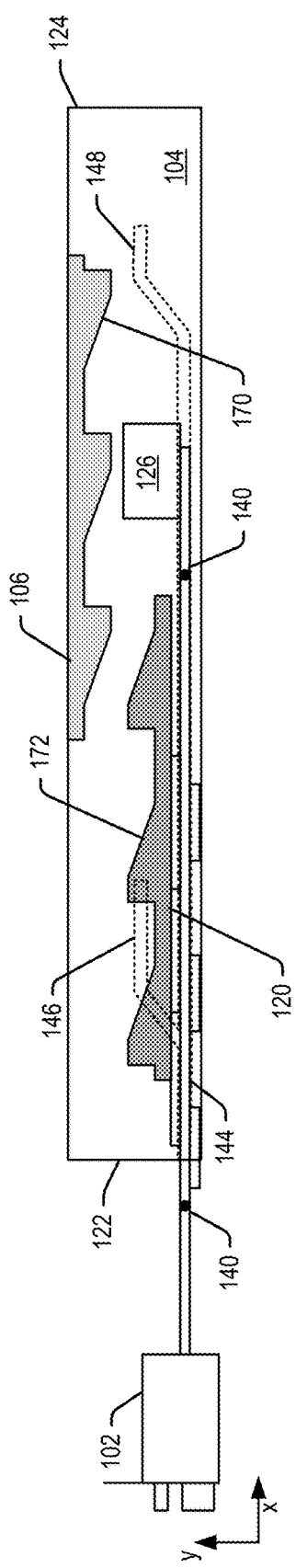
FIGS. 12 and 13 are cross-sectional edge views of an enclosure bay and printed circuit board assembly according to another alternative embodiment of the present technology.
Figure 13:
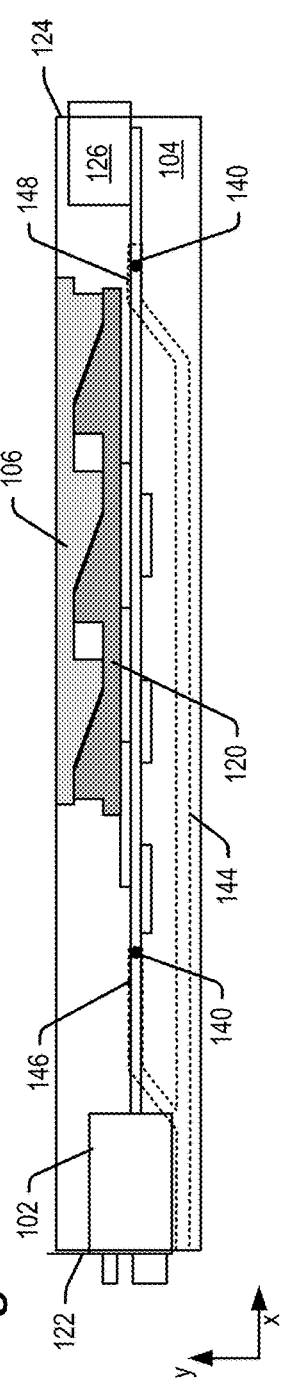

FIGS. 12 and 13 illustrate a further embodiment, where the cold plate 106 includes a number of ramps 170 extending laterally (perpendicular to the x-axis). Likewise, the vapor chamber 120 may include a number of laterally extending ramps 172 perpendicular to the x-axis, in corresponding relation and spacing to the ramps 170.

As indicated in FIGS. 12 and 13, the PCB assembly 102 may be slid into a bay 104 with guide pins 140 riding within guide rails 144 as explained above so that there is a clearance space between the ramps 170 on the one hand and the sockets 126 and ramps 172 on the other. Once the sockets 126 are clear of the cold plate 106 upon insertion along the x-axis, the guide pins 140 may enter channels 146 and 148 to lift the PCB assembly 102 upward toward cold plate 106 to allow mating of the sockets 126 with the backplane 130. At some point after electrical connection of the sockets 126 with the backplane 130, and before a dead stop of the sockets 126 against backplane 130, the ramps 172 of vapor chamber 120 engage against the ramps 170 of cold plate 106, as shown in FIG. 13, for efficient heat conduction away from the PCB assembly 102.

In embodiments described above, channels 146 and 148 of guide rails 144 are provided to raise the PCB assembly 102 toward the cold plate 106 once components on the PCB assembly 102 have cleared the cold plate 106 upon insertion along the x-axis. In further embodiments, it is understood that channels 146 and 148 may be omitted, and that PCB assembly 102 may fully insert within a bay 104 with pure translation along the x-axis.

One such example of this configuration is shown in FIGS. 14-18. FIG. 14 is a top perspective view shown in cross-section of a PCB assembly 102 including a cold plate 106 and other features as described above. FIG. 15 is a bottom perspective view of a cold plate 106 which may be flipped over relative to the view shown and mounted to (or otherwise formed as part of) an upper surface of bay 104. In this embodiment, instead of having a sloped surface across its entire width, a surface 176 of cold plate 106 has a relatively more narrow angled portion 178 which is sloped relative to the remaining portions of surface 176. The surface 176 includes widths W1 and W2 on either side of angled portion 178 which are planar and not sloped. The widths W1 and W2 correspond to the lengths of sockets 126 in FIG. 14. The width of angled portion 178 corresponds to the space between sockets 126.

FIG. 16 is a cross-sectional side view of a bay 104 including a cold plate 106 according to the embodiment shown in FIGS. 14-15. As noted, cold plate 106 may include the angled portion 178 having a sloped surface provided at an oblique angle with respect to the angle of insertion of the PCB assembly 102 into bay 104. This embodiment includes a single pair of guide rails 144, in opposed walls of the bay 104, extending purely along the x-axis. Referring to FIG. 17, PCB assembly 102 may include two pairs of guide pins 140 for engaging within the pair of guide rails 144 as described above. The PCB assembly 102 is inserted, distal end 124 first, so that the guide pins 140 slide within guide rails 144 as shown in FIG. 17. The sockets align with width dimensions W1 and W2 in cold plate 106 so that there is clearance between the vapor chamber 120 and cold plate 106. The angled portion 178 on cold plate 106 aligns within the space between sockets 126 so again, there is clearance between the vapor chamber 120 and cold plate 106.

Upon full insertion of the PCB assembly 102 (either manually or by actuation of locking levers 132 as explained above), the sockets 126 properly mate with pins in backplane 130 as shown in FIG. 18 to electrically connect the one or more printed circuit boards 110 of PCB assembly 102 with the backplane 130. As also shown in FIG. 18, the angled portion 178 establishes a tight contact interface 150 with angled surface 120a of the vapor chamber 120.

Given the lengths of sockets 126 shown, the angled portion 178 of cold plate 106 has a relatively narrow width in contact with the angled surface 120a of vapor chamber 120. However, it is understood that one or more sockets 126 may have other configurations taking up less space across the width of PCB assembly 102, in which case, the angled portion 178 of cold plate 106 may be wider and have a larger contact interface 150 for better heat conduction.

FIGS. 2-18 are illustrative examples of the present technology. However, other embodiments are contemplated where, in general, the cold plate and vapor chamber include at least portions that are angled with respect to the x-direction of insertion, and are therefore able to exert forces against each other having a force component parallel to the x-axis of insertion of the PCB assembly 102. These forces may be easily established by insertion along the x-axis, manually and/or by actuation of locking levers 132 as described above.

In examples, the angled surfaces on the cold plate and vapor chamber may be able to establish a pressure of 10 to 15 psi against each other. Such contact is sufficient for good thermal conductivity between the vapor chamber and cold plate. It is understood that the pressure established by embodiments of the present technology may be greater or lesser than 10 to 15 psi in further embodiments.

Additionally, it is understood that the present technology is orientation agnostic. That is, FIGS. 2-18 illustrate embodiments where the cold plate 106 is positioned at a top of the bay 104, and the vapor chamber 120 has a sloped surface that faces upward. However, it is understood that the configurations of the cold plate 106 and vapor chamber 120 may be flipped 180°, so that the cold plate 106 is positioned at a bottom of the bay 104, and the vapor chamber 120 has a sloped surface that faces downward. Additionally, it is understood that the present technology may operate in embodiments where the entire enclosure 100 is rotated clockwise or counterclockwise 90° from that shown in the figures.

The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The aspects of the disclosure herein were chosen and described in order to best explain the principles of the disclosure and the practical application, and to enable others of ordinary skill in the art to understand the disclosure with various modifications as are suited to the particular use contemplated.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An enclosure for housing one or more printed circuit board assemblies inserted in an insertion direction into one or more bays of the enclosure, the enclosure comprising:
  a cold plate, fixedly attached to a surface of a bay of the one or more bays, the cold plate comprising a first surface for conducting heat, the first surface of the cold plate provided at an oblique angle with respect to the insertion direction; and
  a vapor chamber formed in a printed circuit board assembly of the one or more printed circuit board assemblies, the vapor chamber comprising a first surface for conducting heat, the first surface of the vapor chamber provided at an angle complementary to the oblique angle of the first surface of the cold plate, the first surface of the cold plate coming together against the first surface of the vapor chamber upon insertion of the printed circuit board assembly into the bay, the complementary angles of the first surface of the vapor chamber and the first surface of the cold plate enabling a contact force between the first surfaces of the cold plate and vapor chamber upon insertion of the printed circuit board assembly into the bay and contact between the first surfaces of the cold plate and vapor chamber, the contact force promoting heat conduction.

2. The enclosure of claim 1, the guide rails configured to constrain the printed circuit board assembly to move in a first direction into the bay and a second direction toward the cold plate.

3. The enclosure of claim 1, further comprising a thermally conductive sheet affixed to the cold plate for providing tolerance with respect to the contact between the first surfaces of the cold plate and the printed circuit board assembly.

4. The enclosure of claim 1, further comprising:
  a backplane in the enclosure; and
  a socket on the printed circuit board assembly, full insertion of the printed circuit board assembly establishing electrical contact between the socket and the backplane.

5. The enclosure of claim 4, wherein the contact between the first surfaces of the cold plate and vapor chamber occurs at a same time as the socket establishes electrical contact with the back plane or after the socket establishes electrical contact with the back plane.

6. The enclosure of claim 1, further comprising:
  a backplane in the enclosure; and
  a socket on the printed circuit board assembly, insertion of the printed circuit board assembly to a first insertion point establishing electrical contact between the socket and the backplane, and contact between the socket and backplane providing a hard stop preventing insertion of the printed circuit board assembly past a second insertion point, the contact between the first surfaces of the cold plate and vapor chamber occurring at or between the first and second insertion points of the printed circuit board assembly.

7. The enclosure of claim 1, further comprising:
  guide rails in opposed side walls of the bay; and
  guide pins on opposed sides of the printed circuit board assembly, the guide pins in the guide rails guiding the printed circuit board assembly into the bay.

8. The enclosure of claim 7, the guide rails configured to constrain the printed circuit board assembly to move in a first direction into the bay and a second direction toward the cold plate.

9. The enclosure of claim 8, the guide rails configured to constrain the printed circuit board assembly to move in the first direction into the bay until a component extending away from the printed circuit board assembly toward the cold plate clears the cold plate upon insertion in the insertion direction, and the guide rails configured to constrain the printed circuit board assembly to move in the second direction toward the cold plate after the component clears the cold plate.

10. The enclosure of claim 7, the guide rails configured to constrain the printed circuit board assembly to move in the single insertion direction into the bay.

11. The enclosure of claim 1, the contact between the first surfaces of the cold plate and vapor chamber occurring at one of a same time as, before or after, the socket establishing electrical contact with the back plane.

* * * * *